United States Patent
Van Sommeren et al.

(10) Patent No.: US 9,798,253 B2
(45) Date of Patent: Oct. 24, 2017

(54) SUPPORT TABLE FOR A LITHOGRAPHIC APPARATUS, LITHOGRAPHIC APPARATUS AND DEVICE MANUFACTURING METHOD

(71) Applicant: ASML Netherlands B.V., Veldhoven (NL)

(72) Inventors: Daan Daniel Johannes Antonius Van Sommeren, Nijmegen (NL); Thomas Poiesz, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/306,676

(22) PCT Filed: Mar. 25, 2015

(86) PCT No.: PCT/EP2015/056364
§ 371 (c)(1),
(2) Date: Oct. 25, 2016

(87) PCT Pub. No.: WO2015/165653
PCT Pub. Date: Nov. 5, 2015

(65) Prior Publication Data
US 2017/0045828 A1    Feb. 16, 2017

(30) Foreign Application Priority Data
Apr. 30, 2014  (EP) .................................. 14166526

(51) Int. Cl.
*G03F 7/20* (2006.01)
*H01L 21/67* (2006.01)
*H01L 21/687* (2006.01)

(52) U.S. Cl.
CPC .......... *G03F 7/70875* (2013.01); *G03F 7/707* (2013.01); *G03F 7/70341* (2013.01);
(Continued)

(58) Field of Classification Search
CPC .. G03F 7/70341; G03F 7/707; G03F 7/70716; G03F 7/70875; G03F 7/70866
See application file for complete search history.

(56) References Cited

U.S. PATENT DOCUMENTS 4,509,852 A    4/1985  Tabarelli et al.
6,952,253 B2  10/2005  Lof et al.
(Continued)

FOREIGN PATENT DOCUMENTS

| EP | 1 420 298 | 5/2004 |
|----|-----------|--------|
| EP | 1 843 386 | 10/2007 |
| WO | 99/49504  | 9/1999 |

OTHER PUBLICATIONS

International Search Report and Written Opinion mailed Jul. 7, 2015 in corresponding International Patent Application No. PCT/EP2015/056364.

*Primary Examiner* — Michelle M Iacoletti
(74) *Attorney, Agent, or Firm* — Pillsbury Winthrop Shaw Pittman, LLP

(57) ABSTRACT

A support table having: a base surface configured to be substantially parallel to a lower surface of a substrate, a plurality of burls each having a respective distal end and a first height above the base surface, the burls arranged to support the substrate by the respective distal ends, and a plurality of elongate raised protrusions protruding above the base surface, each elongate raised protrusion having a second height above the base surface that is less than the first height. The base surface has a plurality of regions within each of which some of the elongate raised protrusions are located. All of the elongate raised protrusions located within each region have substantially the same direction of elongation such that they are substantially parallel to each other
(Continued)

so as to form between the elongate raised protrusions at least one gas flow path substantially parallel to the elongate raised protrusions.

20 Claims, 11 Drawing Sheets

(52) U.S. Cl.
CPC ...... *G03F 7/70716* (2013.01); *G03F 7/70866* (2013.01); *H01L 21/67028* (2013.01); *H01L 21/67051* (2013.01); *H01L 21/6875* (2013.01)

(56) References Cited

U.S. PATENT DOCUMENTS

| | | |
|---|---|---|
| 7,701,550 B2 | 4/2010 | Kemper et al. |
| 7,705,962 B2 | 4/2010 | Kemper et al. |
| 8,970,822 B2 | 3/2015 | Kunnen et al. |
| 2002/0159217 A1 | 10/2002 | Tsuruta et al. |
| 2002/0189940 A1 | 12/2002 | Tsai et al. |
| 2004/0207824 A1 | 10/2004 | Lof et al. |
| 2005/0122503 A1* | 6/2005 | Ottens .................. G03F 7/707 355/72 |
| 2006/0038968 A1 | 2/2006 | Kemper et al. |
| 2006/0158627 A1 | 7/2006 | Kemper et al. |
| 2013/0094005 A1 | 4/2013 | Kunnen et al. |

* cited by examiner

SUPPORT TABLE FOR A LITHOGRAPHIC APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/056364, which was filed on Mar. 25, 2015, which claims the benefit of priority of EP application no. 14166526.5, which was filed on Apr. 30, 2014, and which is incorporated herein in its entirety by reference.

FIELD

The present invention relates to a support table for a lithographic apparatus, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

Utilizing immersion fluid in a lithographic apparatus may introduce certain difficulties. For example, the use of immersion fluid may result in an additional heat load within the lithographic apparatus, which may affect the accuracy of formation of an image on a substrate.

In some instances the heat load may be non-uniform across a substrate, resulting in non-uniform variation of the image. By way of example, a heat load may be caused by operation of a fluid handling system and/or by evaporation of the immersion fluid. These effects may be localized to a part of a substrate. Consequently, there may be a localized temperature change in the substrate, resulting in a localized thermal expansion or contraction of the substrate. This is turn may result in a localized variation in an overlay error and/or critical dimension (CD). A support table may include a conditioning system to condition the temperature of the substrate.

The support table may comprise a plurality of burls to support the substrate. Additionally, the support table may comprise a plurality of protrusions (which may be termed thermal rings) to increase the thermal coupling between the substrate and the support table. The protrusions can restrict the flow of gas between the substrate and the support table. This can slow down clamping or loading of the substrate onto the support table. This is because it takes longer for the gas to be evacuated from the region below the substrate so that the region reaches the target pressure. Similarly, unloading of the substrate can be slowed down. This can reduce the throughput of the lithographic apparatus.

It is desirable, for example, to provide a system in which the speed of clamping or loading can be increased and/or in which throughput can be increased, without reducing thermal coupling between the substrate and the support table.

According to an aspect of the invention, there is provided a support table for a lithographic apparatus, the support table configured to support a lower surface of a substrate, wherein the support table comprises: a base surface configured to be substantially parallel to the lower surface of the substrate supported on the support table, a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and a plurality of elongate raised protrusions protruding above the base surface, each of the elongate raised protrusions having a second height above the base surface, wherein the second height is less than the first height; wherein the base surface comprises a plurality of regions within each of which some of the elongate raised protrusions are located, wherein all of the elongate raised protrusions located within each region have substantially the same direction of elongation such that they are substantially parallel to each other so as to form between the elongate raised protrusions at least one gas flow path substantially parallel to the elongate raised protrusions.

According to an aspect of the invention, there is provided a device manufacturing method, comprising using a lithographic apparatus to transfer a pattern from a patterning device to a substrate, wherein the lithographic apparatus comprises a support table configured to support a lower surface of a substrate, wherein the support table comprises: a base surface configured to be substantially parallel to the lower surface of the substrate supported on the support table, a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and a plurality of elongate raised protrusions protruding above the base surface, each of the elongate raised protrusions having a second height above the base surface, wherein the second height is less than the first height; wherein the base surface comprises a plurality of regions within each of which some of the elongate raised protrusions are located, wherein all of the elongate raised protrusions located within each region have substantially the same direction of elongation such that they are substantially parallel to each other so as to form between the elongate raised protrusions at least one gas flow path substantially parallel to the elongate raised protrusions.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
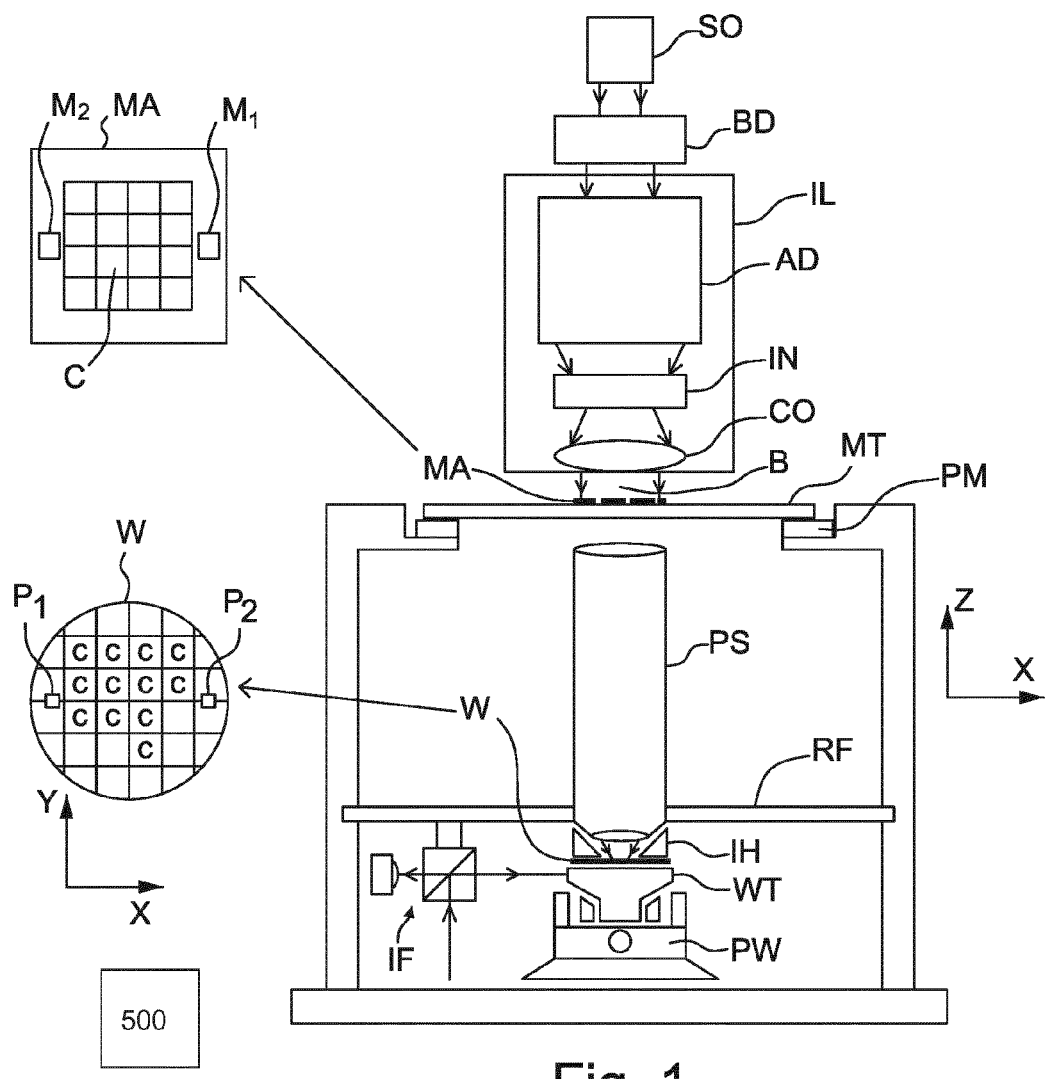
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-6 show different supply devices which can be used in such a system. A sealing feature is present to seal liquid to the localized area. One way which has been proposed to arrange for this is disclosed in PCT patent application publication no. WO 99/49504.

Figure 2:
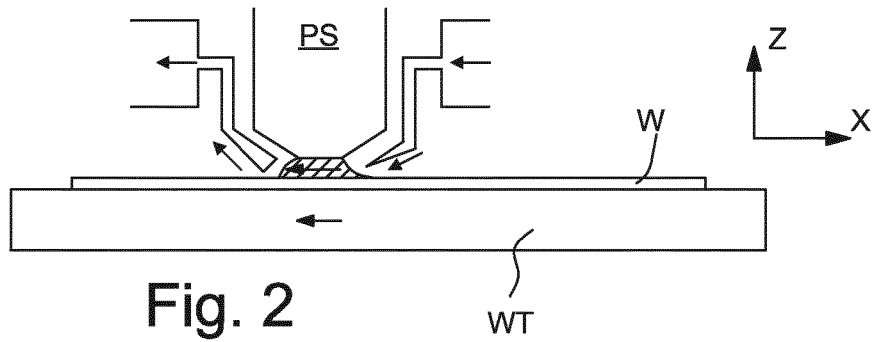
FIGS. 2 and 3 depict a liquid supply system for use in a lithographic projection apparatus.
Figure 3:
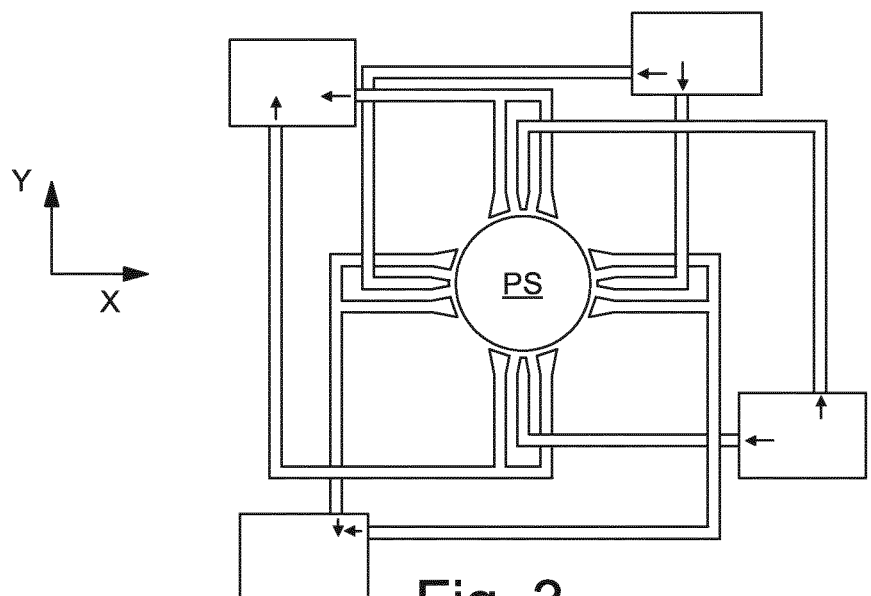

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
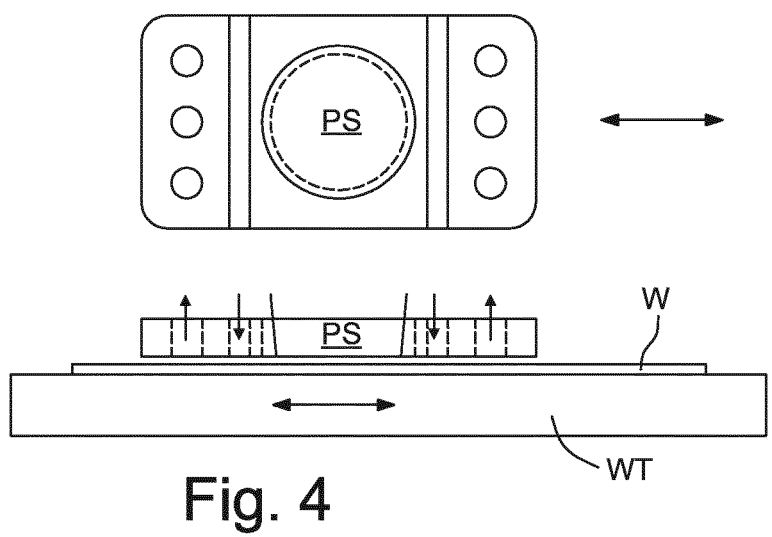
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
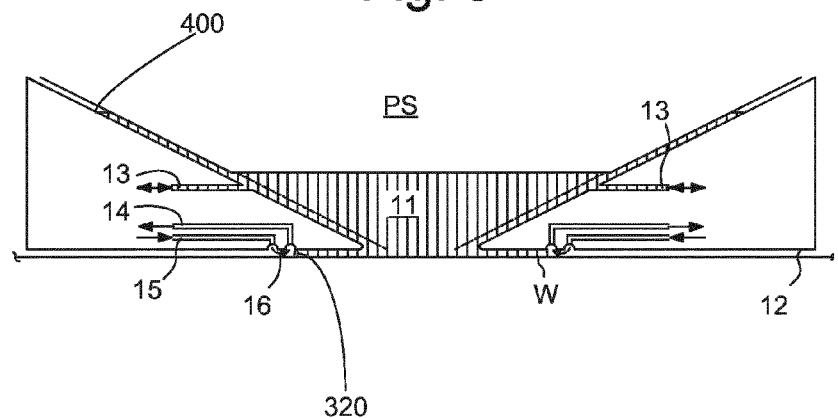
FIG. 5 depicts a further liquid supply system for use in a lithographic projection apparatus.

FIG. 5 schematically depicts a localized liquid supply system or fluid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

Figure 6:
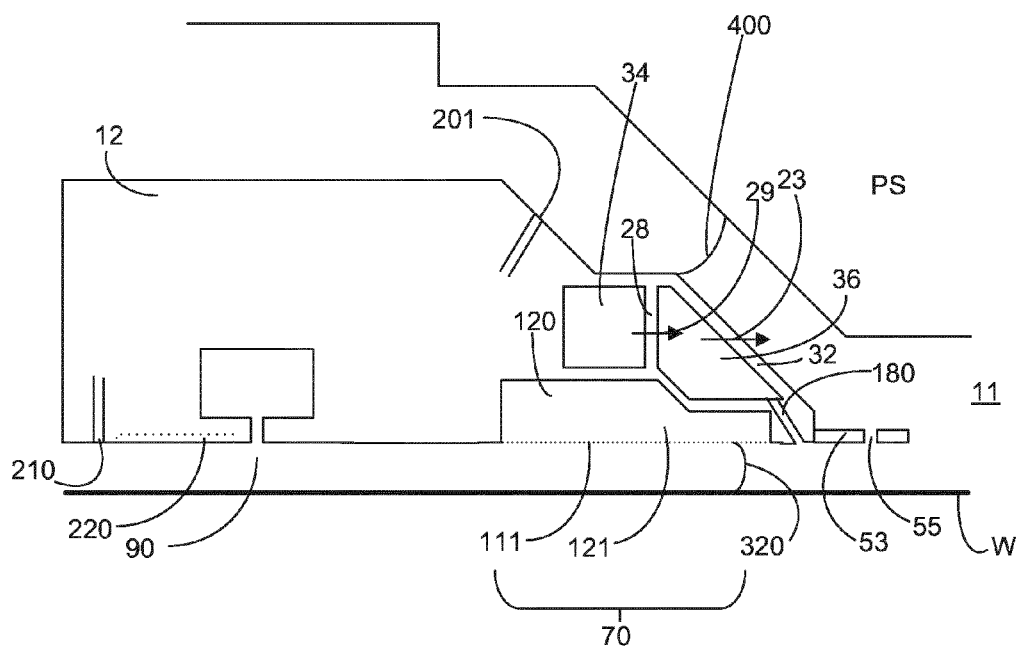
FIG. 6 depicts, in cross-section, a further liquid supply system for use in a lithographic projection apparatus.

FIG. 6 illustrates a fluid handling structure 12 which is part of a liquid supply system. The fluid handling structure 12 extends around the periphery (e.g. circumference) of the final element of the projection system PS.

A plurality of openings 23 in the surface which in part defines the space 11 provides the liquid to the space 11. The liquid passes through openings 29, 23 in side walls 28, 32 respectively through respective chambers 34, 36 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 53 which extends into the space 11. The control plate 53 may have an opening 55 to permit flow liquid therethrough; the opening 55 may be beneficial if the control plate 53 is displaced in the Z direction (e.g., parallel to the optical axis of the projection system PS). Radially outwardly of the flow control plate 53 on the bottom surface of the fluid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature of a meniscus 320 of the liquid.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet 120 which is covered in a porous material 111 which is used to separate liquid from gas to enable single-liquid phase liquid extraction. An underpressure in chamber 121 is chosen such that the meniscuses formed in the holes of the porous material 111 prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than 90°, desirably less than 85° or desirably less than 80°, to the immersion liquid, e.g. water.

Radially outward of gas knife 90 may be provided one or more outlets 210 to remove gas from gas knife 90 and/or liquid that may escape past the gas knife 90. The one or more outlets 210 may be located between one or more outlets of the gas knife 90. To facilitate channelling of fluid (gas and/or liquid) to the outlet 210, a recess 220 may be provided in the liquid confinement structure 12 that is directed toward outlet 210 from outlets of the gas knife 90 and/or from between outlets of the gas knife 90.

Figure 7:
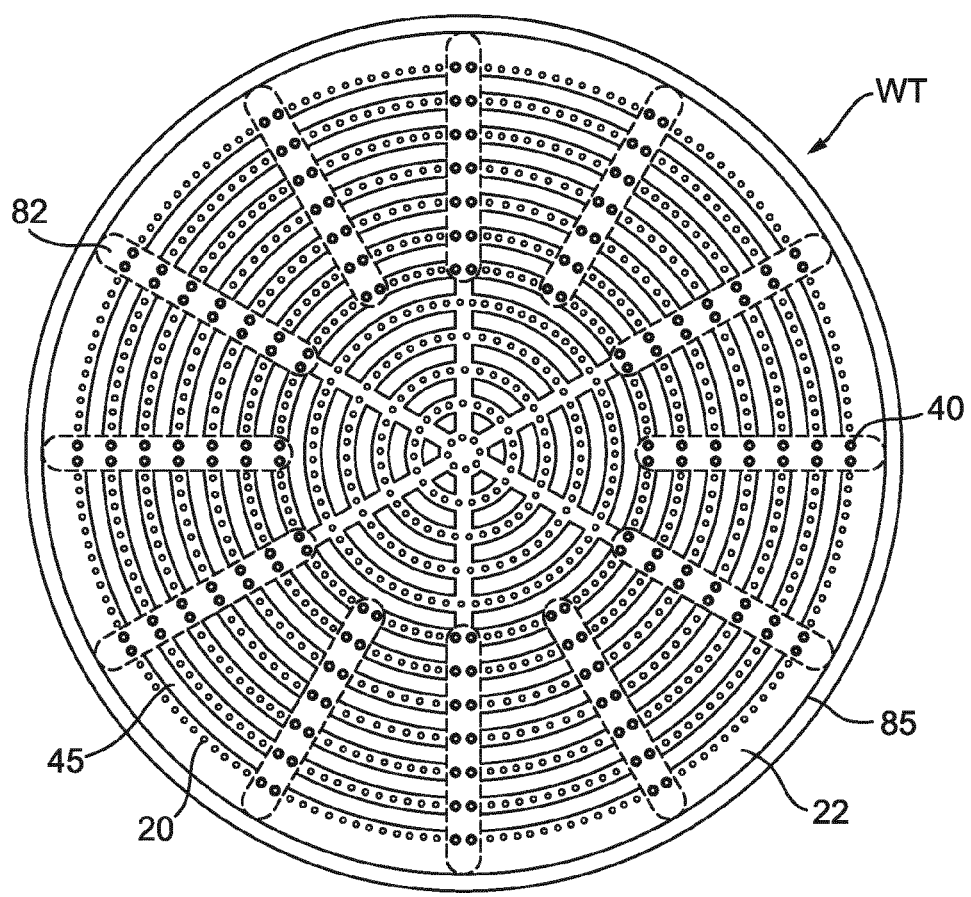
FIG. 7 depicts, in plan, a support table for a lithographic apparatus.

FIG. 7 depicts a support table WT for a lithographic apparatus. The support table WT is configured to support a lower surface of a substrate W. The support table WT comprises a base surface. The base surface is configured to be substantially parallel to a lower surface of a substrate W supported on the support table WT. The support table WT comprises a plurality of burls 20. The burls 20 protrude above the base surface. Each of the plurality of burls 20 has a respective distal end. The burls 20 are arranged such that, when a substrate W is supported by the support table WT, the substrate W is supported by the respective distal end of each of the plurality of burls 20.

In use, a substrate W is supported by the support table WT. When a substrate W is supported by the support table WT, the substrate W is supported by the respective distal end of each of the burls 20.

In use the fluid handling structure 12 puts a thermal load on the substrate W. For example, the thermal load of the fluid handling structure 12 can cool down the substrate W and/or the support table WT.

As depicted in FIG. 7, the support table WT comprises a plurality of elongate raised protrusions 45. The elongate raised protrusions 45 are separated by gaps. The plurality of elongate raised protrusions 45 protrude above the base surface 22 between the burls 20. The burls 20 protrude from the base surface further than the elongate raised protrusions 45. In the construction depicted in FIG. 7, the elongate raised protrusions 45 are configured to form a series of concentric annuli. Each annulus is divided into sections. Each section corresponds to an elongate raised protrusion 45.

By providing the plurality of elongate raised protrusions 45, the gas layer thickness between the substrate W and the support table WT is reduced where the elongate raised protrusions 45 are positioned. This increases the thermal coupling between the substrate W and the support table WT. The tops of the elongate raised protrusions 45 are lower than the tops of the burls 20. The elongate raised protrusions 45 are not in contact with the substrate W. Otherwise the elongate raised protrusions 45 would influence the flatness of the substrate W.

In use, a substrate W is held by the support table WT. In particular, the substrate W may be clamped to the support table WT. The clamping may be assisted by having the region between the substrate W and the support table WT at a lower pressure compared to ambient pressure (i.e. the pressure surrounding the substrate W and the support table WT). The region enclosed by the support table WT and the substrate W may be at near vacuum pressure such that the substrate W is vacuum clamped to the support table WT.

In an embodiment the support table WT comprises one or more holes formed therein. The holes facilitate clamping of the substrate W. Gas may be extracted through the holes from the region enclosed by the substrate W and the support table WT, thereby reducing the pressure in this region for clamping of the substrate W.

The elongate raised protrusions 45 that improve thermal coupling between the substrate W and the support table WT can restrict the flow of gas from below the substrate W towards the holes. This can slow down clamping or loading of the substrate W onto the support table WT. This can reduce the throughput of the lithographic apparatus. The elongate raised protrusions 45 can create a non-uniformity in the vacuum (or near vacuum) below the substrate W. Such a non-uniformity in the vacuum below the substrate W can influence the flatness of the substrate W.

The elongate raised protrusions 45 are arranged such that a plurality of the gaps (that separate the elongate raised protrusions 45) are aligned to form gas flow paths 82 towards an edge of the base surface.

The gaps between the elongate raised protrusions 45 make flow of gas easier. The gaps between the elongate raised protrusions 45 may reduce local reductions in the under pressure used for vacuum clamping a substrate W to the support table WT.

As depicted in FIG. 7, the elongate raised protrusions 45 may be arranged to form rings, which may be termed thermal rings. The thermal rings enhance the heat transfer between the substrate W and the support table WT. The increased heat transfer improves overlay performance of the lithographic apparatus. However, the thermal rings formed by the elongate raised protrusions 45 can act as a barrier for the gas flow in the region between the substrate W and the support table WT.

During a clamping process, the substrate W may be lowered onto the support table WT. Gas is evacuated from the region between a substrate W and the support table WT so as to produce a clamping force that holds the substrate W onto the support table WT. Particularly when the substrate W is lowered to a distance above the burls 20 comparable to the height of the elongate raised protrusions 45 (above the base surface), the thermal rings can significantly reduce the gas flow.

Figure 8:
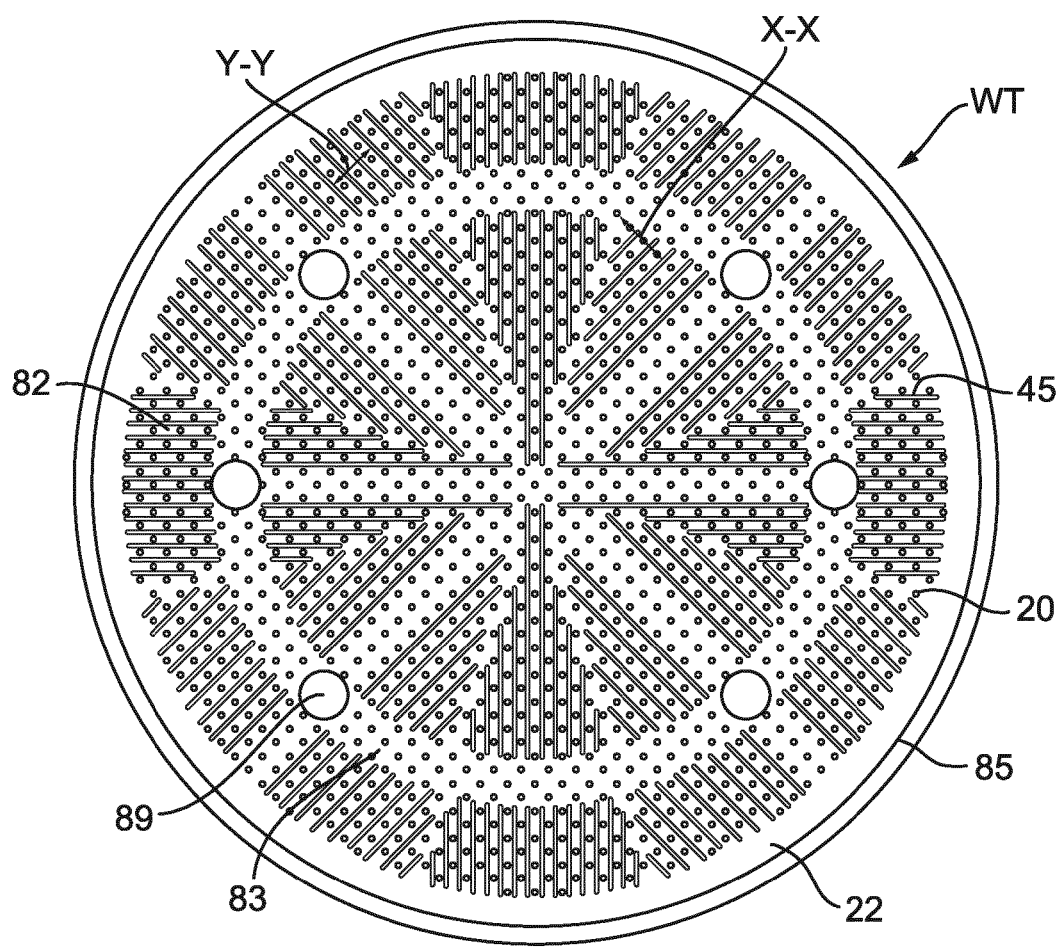
FIGS. 8 to 11 each depict, in plan, a support table according to an embodiment of the invention.

FIG. 8 depicts a support table WT according to an embodiment of the present invention. The support table WT is for a lithographic apparatus. The support table WT is configured to support a lower surface of the substrate W.

The support table WT comprises a base surface 22. In an embodiment, the base surface 22 is configured to be substantially parallel to the lower surface of the substrate W supported on the support table WT. In an embodiment, the distal ends of the burls 20 are positioned along a plane that supports the substrate W in a flat orientation.

The support table WT comprises a plurality of burls 20. The burls 20 protrude above the base surface 22. Each of the plurality of burls 20 has a respective distal end. Each burl 20 has a first height H1 above the base surface 22. The plurality of burls 20 are arranged such that, when the substrate W is supported by the support table WT, the substrate W is supported by the respective distal end of each of the plurality of the burls 20.

The burls 20 are used to hold the substrate W to the support table WT with relatively low contact between the substrate W and the support table WT. For example, in the region of from about 1% to about 3% of the area of the substrate W is in contact with the burls 20 of the support table WT. By having a low amount of contact, contamination sensitivity is reduced.

Such an arrangement may minimize or reduce the total area of the substrate W in contact with the support table WT, minimizing or reducing the likelihood of contaminants being transferred between the support table WT and the substrate W and/or minimizing or reducing the likelihood of a contaminant being located between the substrate W and the support table WT, which may result in a deformation of the substrate W.

In an embodiment, the space around the burls 20, below the substrate W, may be connected to an under pressure source. Accordingly, the substrate W may be vacuum clamped to the support table WT.

Figure 14:
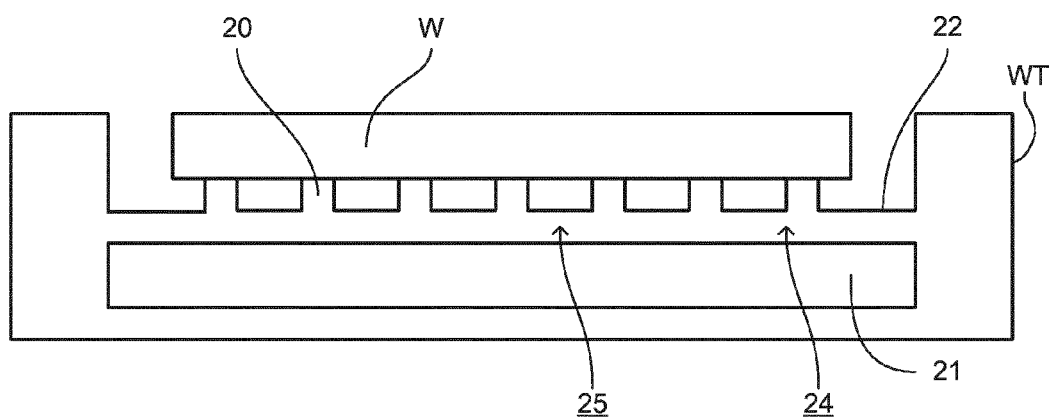
FIG. 14 depicts, in cross-section, a support table according to an embodiment of the invention.

In an embodiment the support table WT includes a conditioning system 21 (e.g. see FIG. 14). The conditioning system 21 supplies heat to and/or removes heat from the support table WT (i.e. the part of the support table WT that supports the substrate W). The support table WT can condition the substrate W during exposures so as to reduce deformation of the substrate W due to the thermal load of the fluid handling structure 12. The conditioning system 21 can condition the support table WT itself. In an embodiment the conditioning system 21 supplies heat to and/or removes heat from the rest of the support table WT. Conditioning the support table WT can reduce deformation of the support table WT. A reduction in deformation of the support table WT can result in a reduction in the deformation of the substrate W.

In an embodiment, the conditioning system 21 may comprise a channel within the support table WT. A conditioning fluid may be provided to flow through the channel. In an embodiment, the conditioning system 21 may include a heater system that can provide heat to the support table WT. In an embodiment the conditioning system 21 may be controlled by a controller 500 that may provide improved control of the conditioning system 21. Features of the conditioning system 21 are disclosed in U.S. patent application publication no. 2013/094005, the entire contents of which are herein incorporated by reference.

The thermal load on the substrate W caused by the fluid handing structure 12 can deform the substrate W. For example, the substrate W can shrink. The burls 20 are stiff so as to suppress the deformation of the substrate W. The conditioning system 21 of the support table WT conditions the temperature of the substrate W.

In the event of a local heat load acting on the substrate W and/or the support table WT, there may be a local temperature variation within, for example, the substrate W, resulting in a local thermal expansion or thermal contraction, most significantly in a direction parallel to the upper and lower major faces of the substrate W. However, the thermal expansion and/or thermal contraction of the substrate W may be resisted by the support table WT, to which the substrate W is clamped. In particular, the forces to resist the thermal expansion and/or thermal contraction may be applied to the substrate W via the burls 20.

As depicted in FIG. 14, in order to reduce or minimize temperature change within a substrate, the conditioning system 21 may be provided that supplies heat to and/or removes heat from the support table WT. Accordingly, heat can be supplied or removed in order to compensate for a heat load on the substrate W and/or support table WT. The conditioning system 21 may provide heat directly to or remove heat directly from the support table WT to compensate for a heat load on the support table WT. Furthermore, the conditioning system 21 may provide heat to or remove heat from the support table WT such that heat flows from the support table WT to the substrate W, or from the substrate W to the support table WT, in order to compensate for a heat load on the substrate W.

In an embodiment, the support table WT, the conditioning system 21, or both, is configured such that, during use, heat transfer to or from the substrate W resulting from the operation of the conditioning system 21 is not uniform across the substrate W.

In particular, in an embodiment, the system is configured such that the heat transfer to or from the substrate W per unit area of the substrate W is greater in one or more regions of the substrate at the edge of the substrate than in one or more regions located at or near the center of the substrate W. In other words, the support table WT and/or conditioning system 21 are configured such that the effect of the conditioning system 21 is greater at the edge region of a substrate W than in the central region. Such a system may be configured such that, for a given heat load, the temperature change of a substrate W in its edge region may be less than the temperature change of the substrate W in its central region. This may compensate for any variation in the thermal expansion and/or thermal contraction across a substrate W for a given local temperature change. Accordingly, the variation in the resulting expansion and/or contraction of the substrate across the substrate W may be reduced or minimized.

However, due to the limited contact area between the substrate W and the support table WT, the thermal coupling between the substrate W and the support table WT is relatively low. The low thermal coupling can cause the substrate W to undergo greater temperature variation compared to the temperature variation of the support table WT.

This is undesirable. In particular, the low amount of contact area between the substrate W and the support table WT restricts the extent to which the temperature of the substrate W can be conditioned by the conditioning system 21 of the support table WT. It would be undesirable to increase the amount of contact between the substrate W and the support table WT because this would increase the contamination sensitivity.

As depicted in FIG. 8, in an embodiment the support table WT comprises a plurality of elongate raised protrusions 45. The elongate raised protrusions 45 protrude above the base surface 22. Each of the elongate raised protrusions has a second height H2 above the base surface 22. The second height H2 is less than the first height H1. When the substrate W is supported by the support table WT, the substrate W is not supported by the elongate raised protrusions 45. When the substrate W is supported by the support table WT, the substrate W is spaced from the elongate raised protrusions 45. When the substrate W is supported by the support table WT, the substrate W does not come into contact with the elongate raised protrusions 45.

In an embodiment the base surface 22 comprises a plurality of regions. Within each of the regions some of the elongate raised protrusions 45 are located. All of the elongate raised protrusions 45 located within each region have substantially the same direction of elongation such that they are substantially parallel to each other. Gas flow paths 82 substantially parallel to the elongate raised protrusions 45 are thereby formed between the elongate raised protrusions 45.

For example, in the arrangement depicted in FIG. 8, the base surface 22 comprises eight regions. The boundary between adjacent regions is defined by a change in direction of elongation of the elongate raised protrusions 45. In the arrangement depicted in FIG. 8, all of the elongate raised protrusions 45 located within each region have the same direction of elongation such that they are parallel to each other. Gas flow paths 82 parallel to the elongate raised protrusions 45 are thereby formed between the elongate raised protrusions 45. This is different from the arrangement depicted in FIG. 7 in which gas flow paths 82 are perpendicular to the elongate raised protrusions 45.

Although in the arrangement depicted in FIG. 8 the elongate raised protrusions 45 are parallel, this is not essential. For example, in an embodiment the elongate raised protrusions 45 located within each region are substantially parallel to each other, having directions of elongation that deviate by no more than 10 degrees from each other. By providing that the directions of elongation deviate by no more than 10 degrees from each other, the gas flow paths 82 within each region have substantially parallel sides, thereby improving gas flow along the gas flow paths 82.

In an embodiment the elongate raised protrusions 45 are directed towards an edge of the base surface 22 so as to form between the elongate raised protrusions 45 at least one gas flow path 82 towards an edge of the base surface 22. The edge of the base surface 22 is at the edge of the support table WT. The edge of the base surface 22 is the edge of the circular support table WT when depicted in plan view, as shown in FIG. 8, for example.

The elongate raised protrusions 45 are directed towards the edge of the base surface 22. The elongate raised protrusions 45 have a direction of elongation. The direction of elongation of the elongate raised protrusions 45 has a radial component. This is different from the elongate raised protrusions 45 of the support table WT depicted in FIG. 7. In the support table WT depicted in FIG. 7, the elongate raised protrusions 45 are not directed towards the edge of the base surface 22. The elongate raised protrusions 45 are directed azimuthally or tangentially (i.e. not radially). A direction of elongation of the elongate raised protrusions 45 does not have a radial component. The direction of elongation of the elongate raised protrusions 45 is azimuthal or tangential.

As depicted in FIG. 8, there is formed between the elongate raised protrusions 45 at least one gas flow path 82. The gas flow paths 82 are substantially parallel to the elongate raised protrusions 45. In an embodiment the gas flow paths 82 are directed towards the edge of the base surface 22.

During a clamping process, mounting pins (not shown) support the substrate W above the support table WT. In an embodiment the mounting pins are controlled by the controller 500. The substrate W is lowered towards the support table WT. The substrate height H of the substrate W above the support table WT is the distance from the lower surface of the substrate W to the distal ends of the burls 20. In order to clamp the substrate W onto the support table WT, gas is evacuated from the region between the substrate W and the support table WT. The evacuation time of the gas is the time taken for the region between the substrate W and the support table WT to reach a target pressure so as to provide a target clamping force. The evacuation time of the gas when the substrate height H is comparable to, or less than, the second height H2 (of the elongate raised protrusions 45) may typically span approximately two thirds of the total time of the substrate loading process. Any reduction in the evacuation time of the gas can reduce the total substrate loading process time.

As a first approximation, the gas evacuation time may be indirectly proportional to the volume flux of the gas evacuating from the region between the substrate W and the support table WT. The thermal rings formed by the elongate raised protrusions 45 depicted in FIG. 7 reduce the volume flux of the gas during evacuation, thereby increasing the gas evacuation time. The effect of the elongate raised protrusions 45 can be particularly significant for the gas flow when the substrate height H is comparable to, or less than, the second height H2. The process of evacuating gas from the region below the substrate W begins before the substrate W comes into contact with the burls 20. When the substrate W is clamped onto the support table WT, the substrate height H is zero.

In the description below, the volume fluxes are per unit circumference of the support table WT. For the support table WT depicted in FIG. 7 and a support table WT according to an embodiment of the present invention, the volume flux of the evacuating gas can be considered in two parts. One part of the volume flux of evacuating gas corresponds to the gas flow along the gas flow paths 82. This part may be termed the gas flow path volume flux Q82. The gas flow path volume flux Q82 is related to the first height H1 (of the burls 20) and the substrate height H as follows.

$$Q82 \sim (H+H1)^3$$

In words, the gas flow path volume flux Q82 is approximately proportional to the cube of the sum of the substrate height H and the first height H1.

The other part of the volume flux corresponds to the gas flow over the elongate raised protrusions 45. This part may be termed the protrusions volume flux Q45. The protrusions volume flux Q45 is related to the substrate height H, the first height H1 (of the burls 20) and the second height H2 (of the elongate raised protrusions 45) as follows.

$$Q45 \sim (H+H1-H2)^3$$

In words, the protrusions volume flux Q45 is approximately proportional to the cube of the sum of the substrate height H and the difference between the first height H1 and the second height H2.

In an embodiment, the second height H2 of the elongate raised protrusions 45 is greater than the difference between the first height H1 and the second height H2. In an embodiment the second height H2 is at least 90% of the first height H1. For part of the gas evacuation process the substrate height H may be of the same order of magnitude as the second height H2 of the elongate raised protrusions 45.

By making an approximation that the substrate height H is much greater than the difference between the first height H1 and the second height H2 (i.e. H>>H1-H2), the protrusions volume flux Q45 is approximately proportional to the cube of the substrate height H (i.e. $Q45 \sim H^3$). By further approximating that the substrate height H and the second height H2 are comparable, the gas flow path volume flux Q82 is approximately proportional to the cube of twice the substrate height H (i.e. $Q45 \sim (2H)^3$, which means $Q45 \sim 8H^3$).

Based on the above approximations, the gas flow path volume flux Q82 may be approximately eight times greater than the protrusions volume flux Q45 per unit circumference of the support table WT.

The elongate raised protrusions 45 significantly reduce the volume flux of evacuating gas, thereby significantly increasing the evacuation time, and hence loading time. During evacuation of the gas, the region between the substrate W and the support table WT is connected to an under pressure. If the gas cannot evacuate quickly enough, then a pressure can build up that can deform the shape of the substrate W. The pressure can deform the substrate W such that the surface of the substrate W is not flat. For example, the substrate W can be deformed to have a shape similar to that of a sombrero. A deformed substrate W is undesirable and can prevent proper functioning of the lithographic apparatus.

In order to avoid the substrate deformation problem, the magnitude of the under pressure can be reduced. However, this increases the substrate loading time, which reduces throughput of the lithographic apparatus.

According to an embodiment of the present invention, by providing that the gas flow paths 82 are substantially parallel to the elongate raised protrusions 45, the proportion of the area of the support table WT that corresponds to a gas flow path 82 is increased. This is achieved without reducing the total area of the elongate raised protrusions 45, which affects the thermal coupling between the substrate W and the support table WT. The elongate raised protrusions 45 are thermally significant with respect to the thermal conduct with the substrate W.

By providing that the gas flow paths 82 are substantially parallel to the elongate raised protrusions 45, the proportion of the circumference of the support table WT covered with the gas flow paths 82 is increased. By increasing the proportion of the circumference covered with gas flow paths 82, the gas evacuation time can be decreased, without unduly increasing the possibility of substrate deformation. This improves throughput of the lithographic apparatus by reducing the substrate loading time.

The proportion of the base surface 22 corresponding to gas flow paths 82 is higher for the present invention compared to the support table WT shown in FIG. 7. This can be seen by a comparison between FIGS. 7 and 8, for example.

The volume flux of evacuating gas may increase approximately linearly with the increase in proportion of the base surface 22 covered by the gas flow paths 82. Based on approximations, a proportion of the base surface 22 covered by gas flow path 82 may be increased by a factor of about 5 to 10, compared to the thermal rings design depicted in FIG. 7. The total volume flux of evacuating gas may be increased by a factor of about 5 to 10 in the present invention. The evacuation time of the gas, particularly for when the substrate height H is comparable to the second height H2, can be significantly decreased. This decreases the substrate loading time.

Each of the elongate raised protrusions 45 defines an axial direction. The axial direction corresponds to the overall direction of elongation of the elongate raised protrusion 45. As depicted in FIG. 8, in an embodiment the elongate raised protrusions 45 may be substantially straight.

Figure 9:
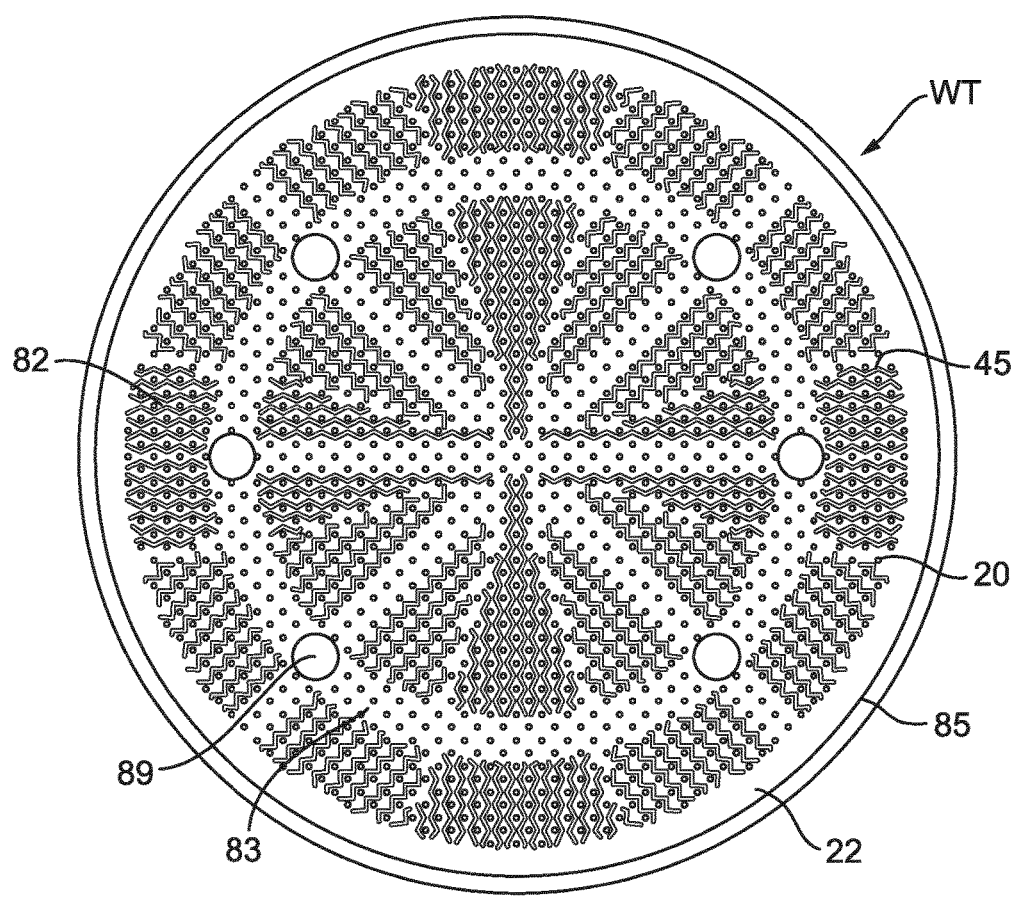

FIG. 9 depicts a table WT according to an embodiment of the present invention. In an embodiment each elongate raised protrusion 45 is arranged to have a zig-zag shape so as to be positioned between the burls 20. Being positioned between the burls 20 means that no burl 20 is positioned on top of the elongate raised protrusion 45.

Figure 10:
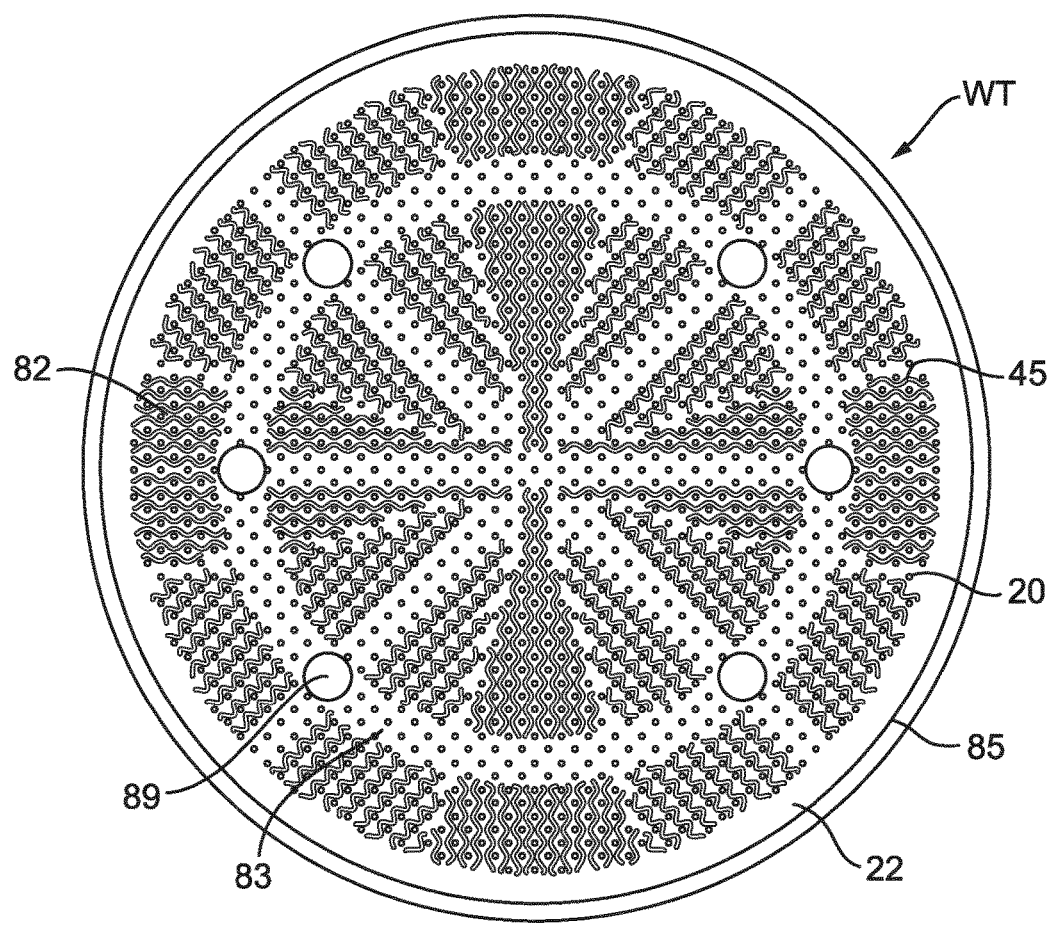

FIG. 10 depicts a support table WT according to an embodiment of the present invention. In an embodiment at least one of the elongate raised protrusions 45 is arranged to have a meandering shape in the axial direction so as to be positioned between the burls 20. For example, at least one of the elongate raised protrusions 45 may take the form of a sine wave when viewed in plan.

In an embodiment at least one of the elongate raised protrusions 45 may have a zig-zag shape and at least one of the elongate raised protrusions 45 may have a meandering shape in the axial direction. In an embodiment, one portion of an elongate raised protrusion 45 may be angular (e.g. zig-zag) and another portion of the same elongate raised protrusion 45 may have a meandering shape, or be straight, for example.

Figure 11:
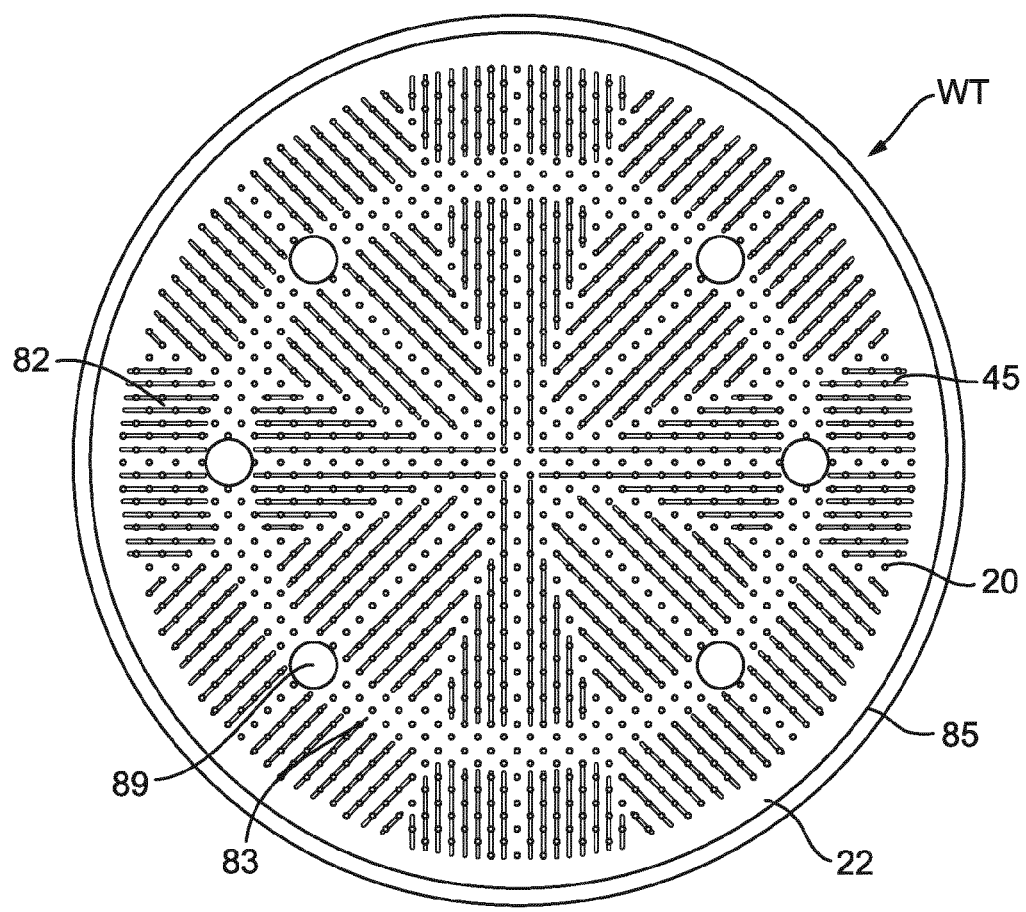

In an embodiment the elongate raised protrusions 45 are positioned between the burls 20. However, this is not necessarily the case. For example, as depicted in FIG. 11, some of the burls 20 may be placed on top of the elongate raised protrusions 45. The distal ends of the burls 20 protrude the first height H1 above the base surface 22 regardless of whether they are positioned on top of the elongate raised protrusion 45 or not. For example, if the second height H2 of the elongate raised protrusions 45 is 95% of the first height H1 of the burls 20, then any burl 20 positioned on the elongate raised protrusion 45 would protrude the further 5% above the elongate raised protrusion 45.

Figure 12:
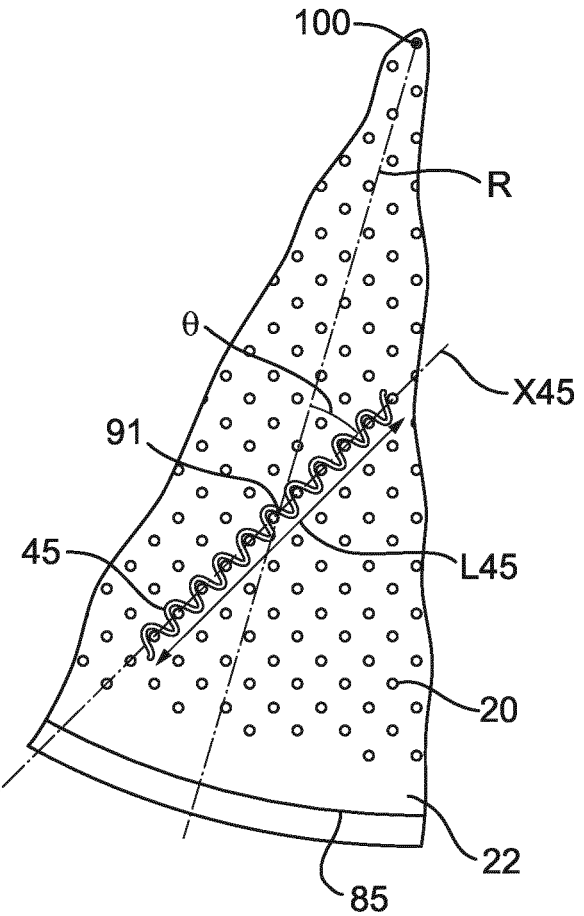
FIG. 12 depicts, in plan, an enlarged view of a section of a support table according to an embodiment of the present invention.

Each of the elongate raised protrusions 45 has an axis of elongation X45. The axis corresponds to the axial direction, i.e. the direction of elongation of the elongate raised protrusion 45. In FIG. 12, the axis of elongation X45 of an elongate raised protrusion 45 is shown. FIG. 12 depicts a portion of a support table WT according to an embodiment of the present invention. A segment of the support table WT is shown. FIG. 12 shows the centre 100 of the base surface 22 of the support table WT and the centre 91 of the elongate raised protrusion 45. The radius R extends from the centre 100 of the base surface 22 and passes through the centre 91 of the elongate raised protrusion 45.

In an embodiment at least one, and optionally each, of the elongate raised protrusions 45 has an axis of elongation X45 that deviates by no more than about 25 degrees from the radius R of the base surface 22 that passes through the centre

91 of the elongate raised protrusion 45. An angle θ defined between the axis of elongation X45 of the elongate raised protrusion 45 and a radius R of the base surface 22 that passes through a centre of the elongate raised protrusion 45 is no more than about 25 degrees. By providing a maximum angular deviation θ of about 25 degrees between the axis of elongation X45 of the elongate raised protrusion 45 and the radius R, it can be ensured that the evacuation time is reduced. By reducing the angular deviation θ, the gas evacuation time can be reduced. In an embodiment, the axis of the elongate raised protrusions 45 deviates by no more than about 20 degrees, and optionally no more than about 15 degrees from the radius R of the base surface 22 that passes through the centre 91 of the elongate raised protrusion 45.

The pattern formed by the elongate raised protrusions 45 is not particularly limited. In FIG. 8, the elongate raised protrusions 45 are orientated along zero degrees, 45 degrees, 90 degrees, 135 degrees, 180 degrees, 225 degrees, 270 degrees and 315 degrees relative to the same frame of reference (e.g. a radius of the support table WT). By having a limited number of orientation directions, it becomes easier to manufacture the support table WT. However, other directions of orientation are possible. Simpler patterns have the advantage of making it easier to manufacture the support table WT.

In an embodiment each of the elongate raised protrusions 45 has a direction of elongation that comprises a radial component and a tangential component, wherein a magnitude of the radial component is greater than a magnitude of the tangential component.

In an embodiment the support table WT comprises a plurality of holes 89 formed therein spaced apart a distance from the centre 100 of the base surface 22. The holes 89 may be used to communicate the region between the substrate W and the support table WT with an under pressure for gas evacuation.

In an embodiment, an outer set of the elongate raised protrusions 45 are positioned in an outer region 24 (see FIG. 14) radially outward of the holes 89. In an embodiment an inner set of the elongate raised protrusions 45 are positioned in an inner region 25 (see FIG. 14) radially inward of the holes 89. An azimuthal (e.g. substantially annular) gas flow path 83 may be formed spaced the distance from the centre 100 of the base surface 22. Such a configuration is depicted in each of FIGS. 8 to 11.

By providing the azimuthal gas flow path 83, gas can flow more easily between the holes 89 during gas evacuation. Some of the gas flow paths 82 are in line with one of the holes 89. In this case, gas can flow directly along the gas flow path 82 to the hole 89. However, others of the gas flow paths 82 are not directly in line with a hole 89. In this case, the azimuthal gas flow path 83 can help gas to flow to the hole 89.

In an embodiment the at least one gas flow path 82 is substantially radial with respect to the centre 100 of the base surface 22. However, this is not necessarily the case. As depicted in FIG. 8, for example, some of the gas flow paths 82 are not radial in that they do not form a line with the centre 100 of the base surface 22. However, by providing that the gas flow paths are directed towards the edge of the base surface 22, the gas flow paths 82 help evacuation of gas from the region between the substrate W and the support table WT.

In an embodiment the elongate raised protrusions 45 are directed along the flow direction when gas is evacuated from the region between the substrate W and the support table WT.

Figure 15:
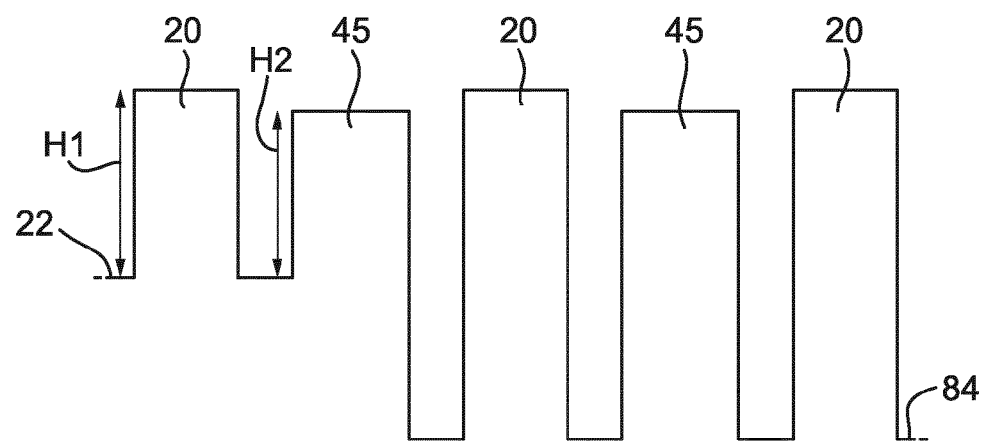
FIGS. 15 and 16 each depict in cross-section details of a support table according to an embodiment of the invention.
Figure 16:
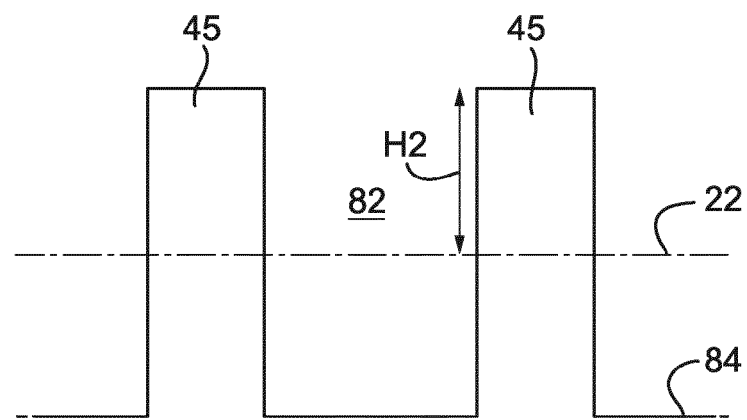

As depicted in FIG. 15 and FIG. 16, in an embodiment a floor 84 of the at least one gas flow path 82 is lower than the base surface 22 such that the at least one gas flow path 82 forms a groove in the base surface 22. FIG. 15 depicts the support table WT in cross-section along the line X-X from FIG. 8. FIG. 16 depicts the support table WT in cross-section along the line Y-Y from FIG. 8. Deeper grooves provide more space and less restriction for gas flow. Gas flow can be increased, thereby improving clamping of the substrate W.

In an embodiment the floor 84 of the straight gas flow paths 82 is at substantially the same level as the base surface 22. By providing the straight gas flow paths 82 and the base surface 22 at substantially the same level, it is made easier to manufacture the support table WT.

In an embodiment, all of the floor 84 of the gas flow paths 82 is at substantially the same distance below the base surface 22, or at the same level as the base surface 22.

By providing the gas flow paths 82, gas flow below the substrate W is increased. During loading of the substrate W, gas is extracted through the hole 89. The speed of gas flow within the gas flow paths 82 is greater compared to the gas flow in other regions of the support table WT.

In an embodiment each gas flow path 82 forms a substantially straight line. However, in an embodiment gas flow paths may be bent or curved. For example, part of a bent gas flow path may extend in the radial direction. Another part of a bent gas flow path may be angled with respect to the radial direction. As another example, the curved gas flow path could have a shape similar to that shown in FIG. 9 or FIG. 10.

In an embodiment each of the elongate protrusions 45 has a length L45 that is at least ten times a mean pitch between the burls 20. The length L45 of the elongate raised protrusion 45 is measured along the axis, i.e. the overall direction of the elongation of the elongate raised protrusion 45. By providing that each of the elongate protrusions 45 has a length L45 that is at least ten times a mean pitch between the burls 20, the number of protrusions 45 required to increase the thermal conductivity between the substrate W and the support table WT is reduced. This makes it easier to manufacture a support table WT having a given level of thermal conductivity between the substrate W and the support table WT.

In an embodiment the elongate raised protrusions 45 are configured to increase thermal conductivity between the support table WT and the substrate W. In an embodiment the elongate raised protrusions 45 speed up radial evacuation of gas from the region between the substrate W and the support table WT.

A variety of different burl patterns can be used in conjunction with the present invention. Differently shaped elongate raised protrusions 45 may be employed. In an embodiment the gas flow path 82 provides an unobstructed streamline between the centre of the base surface 22 and the edge of the base surface 22.

In an embodiment the hole 89 is located within the at least one gas flow path 82. The hole 89 may be in the line of the gas flow paths 82. In an embodiment the gas flow paths 82 may extend radially outwards from the holes 89 towards the edge of the support table WT. In an embodiment each hole 89 is located at one end of a corresponding gas flow path 82. In an embodiment each hole 89 is located at a radially inward end of a corresponding gas flow path 82. Such straight gas flow paths 82 have an advantage of increasing the gas flow in the region between the substrate W and the support table WT where the under pressure connected to the hole 89 can have greatest effect. The gas flow path 82 is a channel leading directly to the hole 89 such that gas flow is greatly increased, thereby speeding up clamping of the substrate W.

In an embodiment one or more of the burls 20 protrude from a floor 84 of the at least one gas flow path 82. This is depicted in FIG. 15, for example. By providing the burls 20 within the gas flow paths 82, flatness of the substrate W supported by the support table WT is increased. By providing the burls 20 within the gas flow paths 82, the maximum distance between burls 20 that support the substrate W is decreased, thereby decreasing the possibility of the substrate W sagging or bowing in between the burls 20.

Figure 13:
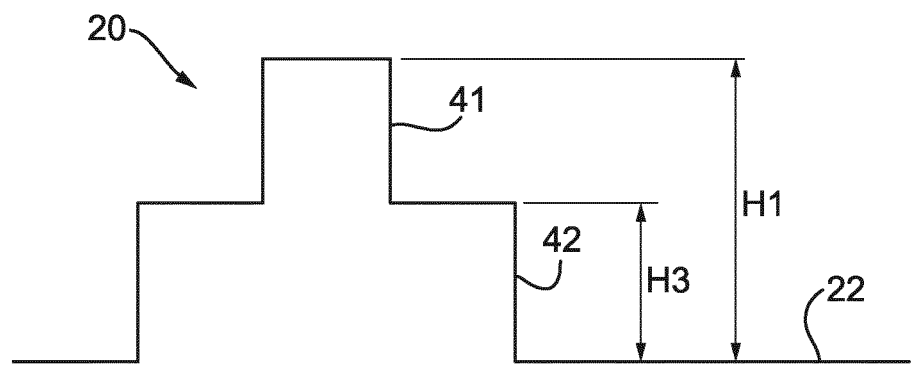
FIG. 13 depicts, in cross-section, details of a support table according to an embodiment of the invention.

FIG. 13 depicts an enlarged view of a section of a support table WT according to an embodiment of the invention, in plan. In an embodiment one or more of the burls 20 is a stepped burl, i.e. has a stepped profile in cross-section in a plane perpendicular to the base surface 22. The stepped profile has a first portion 41 that has the first height H1 and a respective distal end so as to support the lower surface of the substrate W. The stepped profile further has a second portion 42 that surrounds the first portion 41. The second portion 42 protrudes from the floor 84 of the at least one gas flow path 82. The floor 84 of the at least one gas flow path may be at the same level as the base surface 22 or may be lowered relative to the base surface 22. The second portion has a third height H3 above the base surface 22. The third height H3 is the height of the top of the second portion 42 above the base surface 22. The third height H3 is less than the first height H1. Provided that it is sufficiently large, the second portion 42 increases thermal coupling between the substrate W and the support table WT. In an embodiment the second height H2 is substantially equal to the third height H3 such that upper surface of the second portion 42 is substantially parallel with the upper surface of the elongate raised protrusions 45 for improving thermal coupling. This has the benefit of making it easier to manufacture the support table WT.

The burls 20 that have a stepped profile have a first portion 41 that is arranged to be in contact with the lower surface of the substrate W and may correspond to the non-stepped burls 20. The burls 20 that have a stepped profile further include a second portion 42 that does not contact the lower surface of the substrate W. Accordingly, each of the second portions 42 provides an area in which the separation between the support table WT and the lower surface of the substrate W is reduced but does not affect the total area of burls 20 per unit area of the lower surface of the substrate W that is in contact with the substrate W.

The second portion 42 may surround the first portion 41. The size of the second portions 42 need not be the same for all of the burls 20. Accordingly, for example, the width and/or height of the second portions 42 may increase with distance from the center 100 of the base surface 22 such that the resistance to thermal transfer between the support table WT and the substrate W decreases towards the edge of the substrate W. The undesirable effects of temperature changes of the substrate W may be greater at the edge of the substrate W. However, decreased resistance to thermal transfer between the support table WT and the substrate W towards the edge of the substrate W allows for better conditioning to be applied to the edge of the substrate W. Better conditioning at the edge of the substrate W better reduces temperature changes at the edge of the substrate W relative to those in the center, thereby compensating for the greater impact of temperature changes at the edge of the substrate W.

It is not necessary for the burls 20 to have a stepped profile. The second portion 42 may be omitted, thereby increasing the space in the gas flow paths 82. The increased space in the gas flow paths 82 may have the effect of increasing gas flow through the gas flow paths 82.

In an embodiment the support table WT comprises a plurality of holes 89 at a distance from a center of the base surface 22. The support table WT may have a radius with an array of holes 89 that facilitates clamping of the substrate W. However, it is not necessary for there to be an array of holes 89. In an embodiment, there may be only a single hole 89. In an embodiment there may be a plurality of holes 89 at different distances from the center of the base surface 22.

Any lowering of the floor 84 of the gas flow paths 82 relative to the base surface 22 further improves gas flow, thereby further speeding up clamping of the substrate W and throughput of the lithographic apparatus. In an embodiment the floor 84 is at least as far lower than the base surface 22 as the burls 20 protrude above the base surface 22 such that the at least one gas flow path 82 forms a groove in the base surface 22. In this case, the distance between the substrate W and the base surface 22 of the gas flow paths 82 is at least twice the distance between the lower surface of the substrate W and the base surface 22. This facilitates fast gas transport from the edge of the base surface 22 to the center of the base surface 22.

Further optional features of the support table WT are disclosed in U.S. patent application publication no. 2013/094005, the entire contents of which are herein incorporated by reference.

In an embodiment, at least one elongate raised protrusion 45 may be configured such that the separation between the upper surface of the elongate raised protrusion 45 and the lower surface of a substrate W supported by the support table WT is 10 μm or less. In such an embodiment, the separation of the base surface 22 from the lower surface of the substrate W may be 150 μm. Alternatively, the separation between the base surface 22 and the lower surface of the substrate W may be larger, for example 400 μm or more. In an embodiment having a plurality of elongate raised protrusions 45, approximately 50% of the area of the lower surface of a substrate W may be directly above an elongate raised protrusion 45. Accordingly, the thermal conductivity between the support table WT and the substrate W may be improved. In particular, the thermal transfer may be increased by a factor of approximately 2 to 3, all other factors remaining constant. In an embodiment, at least about 10%, or optionally at least about 20%, of the area of the support table WT in plan view is formed by the elongate raised protrusions 45. By providing that at least about 10%, or optionally at least about 20%, of the area of the support table WT in plan view is formed by the elongate raised protrusions 45, the elongate raised protrusions 45 significantly improve the thermal conductivity between the support table WT and the substrate W. In an embodiment, at least about 30%, or optionally at least about 40%, of the area of the support table WT in plan view is formed by the elongate raised protrusions 45. By providing that at least about 30%, or optionally at least about 40%, of the area of the support table WT in plan view is formed by the elongate raised protrusions 45, the elongate raised protrusions 45 even more significantly improve the thermal conductivity between the support table WT and the substrate W. In an embodiment, at most about 50% of the area of the support table WT in plan view is formed by the elongate raised protrusions 45. In an embodiment, the proportion of the area of the support table WT in plan view that is formed by the elongate raised protrusions 45 is within the range of from about 10% to about 50%, within the range of from about 20% to about 50% or within the range of from about 30% to about 50%.

In an embodiment the elongate raised protrusions 45 have a width (when viewed in plan view) that is greater than a width of the burls 20. By providing that the elongate raised protrusions 45 are wider than the burls 20, the elongate raised protrusions 45 provide an area that significantly increases thermal conductivity to the substrate W.

In an embodiment the elongate raised protrusions 45 are made of the same material as the main part of the support table WT. In an embodiment the elongate raised protrusions 45 are made of a material selected so as to improve thermal conductivity to the substrate W via the elongate raised protrusions 45. In an embodiment the elongate raised protrusions 45 are made of a material such as ceramic, siliconised silicon carbide (SiSiC) or high-conductive graphite.

In an embodiment, there is provided a support table for a lithographic apparatus, the support table configured to support a lower surface of a substrate, wherein the support table comprises: a base surface configured to be substantially parallel to the lower surface of the substrate supported on the support table, a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and a plurality of elongate raised protrusions protruding above the base surface, each of the elongate raised protrusions having a second height above the base surface, wherein the second height is less than the first height; wherein the base surface comprises a plurality of regions within each of which some of the elongate raised protrusions are located, wherein all of the elongate raised protrusions located within each region have substantially the same direction of elongation such that they are substantially parallel to each other so as to form between the elongate raised protrusions at least one gas flow path substantially parallel to the elongate raised protrusions.

In an embodiment, at least about 20% of the area of the support table in plan view is formed by the elongate raised protrusions. In an embodiment, each of the elongate raised protrusions is arranged to have a zig-zag shape or to have a meandering shape so as to be positioned between the burls. In an embodiment, the elongate raised protrusions are substantially straight. In an embodiment, for each of the elongate raised protrusions an angle defined between an axis of elongation of the elongate raised protrusion and a radius of the base surface that passes through a center of the elongate raised protrusion is no more than about 25°, and/or wherein each of the elongate raised protrusions has a length at least ten times a mean pitch between the burls. In an embodiment, the support table comprises a plurality of holes formed therein spaced apart a distance from a center of the base surface, wherein an outer set of the elongate raised protrusions are positioned in an outer region radially outward of the holes and an inner set of the elongate raised protrusions are positioned in an inner region radially inward of the holes, so as to form an azimuthal gas flow path at the distance from the center of the base surface. In an embodiment, the at least one gas flow path is substantially radial with respect to a center of the base surface. In an embodiment, a floor of the at least one gas flow path is lower than the base surface such that the at least one gas flow path forms a groove in the base surface. In an embodiment, the second height is at least 90% of the first height. In an embodiment, one or more of the burls has a stepped profile in cross-section in a plane perpendicular to the base surface, wherein the stepped profile has a first portion that has the first height and a respective distal end so as to support the lower surface of the substrate and a second portion that surrounds the first portion and protrudes from a floor of the at least one gas flow path, and the second portion has a third height above the base surface less than the first height. In an embodiment, the support table further comprises a conditioning system configured to supply heat to and/or remove heat from the support table, and/or wherein the elongate raised protrusions are configured to increase thermal conductivity between the support table and the substrate. In an embodiment, each of the elongate raised protrusions has a direction of elongation that comprises a radial component and a tangential component, wherein a magnitude of the radial component is greater than a magnitude of the tangential component. In an embodiment, the elongate raised protrusions located within each region have directions of elongation that deviate by no more than 10° from each other.

In an embodiment, there is provided a lithographic apparatus, comprising a support table as described herein.

In an embodiment, there is provided a device manufacturing method, comprising using a lithographic apparatus to transfer a pattern from a patterning device to a substrate, wherein the lithographic apparatus comprises a support table configured to support a lower surface of a substrate, wherein the support table comprises: a base surface configured to be substantially parallel to the lower surface of the substrate supported on the support table, a plurality of burls protruding above the base surface, each of the plurality of burls having a respective distal end and a first height above the base surface, the plurality of burls arranged such that, when the substrate is supported by the support table, the substrate is supported by the respective distal end of each of the plurality of the burls, and a plurality of elongate raised protrusions protruding above the base surface, each of the elongate raised protrusions having a second height above the base surface, wherein the second height is less than the first height, wherein the base surface comprises a plurality of regions within each of which some of the elongate raised protrusions are located, wherein all of the elongate raised protrusions located within each region have substantially the same direction of elongation such that they are substantially parallel to each other so as to form between the elongate raised protrusions at least one gas flow path substantially parallel to the elongate raised protrusions.

As will be appreciated, any of the above described features can be used with any other feature and it is not only those combinations explicitly described which are covered in this application. For example, an embodiment of the invention could be applied to the embodiments of FIGS. 2 to 4. Furthermore, discussions herein of heating or heaters should be understood to encompass cooling or coolers, respectively.

Furthermore, although embodiments of the invention have been described above in the context of an immersion lithographic apparatus for convenience, it will be appreciated that an embodiment of the invention may be used in conjunction with any form of lithographic apparatus.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A support table for a lithographic apparatus, the support table configured to support a lower surface of a substrate, wherein the support table comprises:
   a base surface configured to be substantially parallel to the lower surface of the substrate supported on the support table;
   a plurality of burls protruding above the base surface, each burl of the plurality of burls having a respective distal end and a first height above the base surface, the plurality of burls arranged such that, when the substrate is supported by the support table, the substrate is supported by the respective distal end of each burl of the plurality of the burls; and
   a plurality of elongate raised protrusions protruding above the base surface, each elongate raised protrusion of the elongate raised protrusions having a second height above the base surface, wherein the second height is less than the first height,
   wherein the base surface comprises a plurality of regions within each of which some of the elongate raised protrusions are located, wherein all of the elongate raised protrusions located within each region have substantially the same direction of elongation such that they are substantially parallel to each other so as to form between the elongate raised protrusions at least one gas flow path substantially parallel to the elongate raised protrusions.

2. The support table of claim 1, wherein at least about 20% of the area of the support table in plan view is formed by the elongate raised protrusions.

3. The support table of claim 1, wherein each elongate raised protrusion of the elongate raised protrusions is arranged to have a zigzag shape or to have a meandering shape so as to be positioned between the burls.

4. The support table of claim 1, wherein the elongate raised protrusions are substantially straight.

5. The support table of claim 1, wherein, for each elongate raised protrusion of the elongate raised protrusions, an angle defined between an axis of elongation of the elongate raised protrusion and a radius of the base surface that passes through a center of the elongate raised protrusion is no more than about 25°, and/or wherein each elongate raised protrusion of the elongate raised protrusions has a length at least ten times a mean pitch between the burls.

6. The support table of claim 1, wherein the support table comprises a plurality of holes formed therein spaced apart a distance from a center of the base surface, wherein an outer set of the elongate raised protrusions are positioned in an outer region radially outward of the holes and an inner set of the elongate raised protrusions are positioned in an inner region radially inward of the holes, so as to form an azimuthal gas flow path at the distance from the center of the base surface.

7. The support table of claim 1, wherein the at least one gas flow path is substantially radial with respect to a center of the base surface.

8. The support table of claim 1, wherein a floor of the at least one gas flow path is lower than the base surface such that the at least one gas flow path includes a groove in the base surface.

9. The support table of claim 1, wherein the second height is at least 90% of the first height.

10. The support table of claim 1, wherein one or more of the burls has a stepped profile in cross-section in a plane perpendicular to the base surface, wherein the stepped profile has a first portion that has the first height and a respective distal end so as to support the lower surface of the substrate, and a second portion that surrounds the first portion and protrudes from a floor of the at least one gas flow path, the second portion having a third height above the base surface less than the first height.

11. The support table of claim 1, further comprising a conditioning system configured to supply heat to and/or remove heat from the support table, and/or wherein the elongate raised protrusions are configured to increase thermal conductivity between the support table and the substrate.

12. The support table of claim 1, wherein each elongate raised protrusion of the elongate raised protrusions has a direction of elongation that comprises a radial component and a tangential component, wherein a magnitude of the radial component is greater than a magnitude of the tangential component.

13. The support table of claim 1, wherein the elongate raised protrusions located within each region have directions of elongation that deviate by no more than 10° from each other.

14. A lithographic apparatus, comprising the support table of claim 1.

15. A device manufacturing method, comprising using a lithographic apparatus to transfer a pattern from a patterning device to a substrate, wherein the lithographic apparatus comprises a support table supporting the substrate, the support table comprising:
   a base surface configured to be substantially parallel to the lower surface of the substrate supported on the support table;
   a plurality of burls protruding above the base surface, each burl of the plurality of burls having a respective distal end and a first height above the base surface, the substrate supported by the respective distal end of each burl of the plurality of the burls; and
   a plurality of elongate raised protrusions protruding above the base surface, each elongate raised protrusion of the elongate raised protrusions having a second height above the base surface, wherein the second height is less than the first height,
   wherein the base surface comprises a plurality of regions within each of which some of the elongate raised protrusions are located, wherein all of the elongate raised protrusions located within each region have substantially the same direction of elongation such that they are substantially parallel to each other so as to form between the elongate raised protrusions at least one gas flow path substantially parallel to the elongate raised protrusions.

16. The method of claim 15, wherein at least about 20% of the area of the support table in plan view is formed by the elongate raised protrusions.

17. The method of claim 15, wherein each elongate raised protrusion of the elongate raised protrusions is arranged to have a zig-zag shape or to have a meandering shape so as to be positioned between the burls.

18. The method of claim 15, wherein the elongate raised protrusions are substantially straight.

19. The method of claim 15, wherein, for each elongate raised protrusion of the elongate raised protrusions, an angle defined between an axis of elongation of the elongate raised protrusion and a radius of the base surface that passes through a center of the elongate raised protrusion is no more than about 25°, and/or wherein each elongate raised protrusion of the elongate raised protrusions has a length at least ten times a mean pitch between the burls.

20. The method of claim 15, wherein the support table comprises a plurality of holes formed therein spaced apart a distance from a center of the base surface, wherein an outer set of the elongate raised protrusions are positioned in an outer region radially outward of the holes and an inner set of the elongate raised protrusions are positioned in an inner region radially inward of the holes, so as to form an azimuthal gas flow path at the distance from the center of the base surface.

* * * * *